United States Patent [19]
Tullis et al.

[11] Patent Number: 4,875,825
[45] Date of Patent: Oct. 24, 1989

[54] METHOD FOR AUTOMATED CASSETTE HANDLING

[75] Inventors: Barclay J. Tullis, Palo Alto; John S. Bailey, Sunnyvale; D. R. Gunawardena, Union City; Ulrich Kaempf, Los Altos, all of Calif.

[73] Assignee: Hewlett-Packard Company, Palo Alto, Calif.

[21] Appl. No.: 119,356

[22] Filed: Nov. 10, 1987

Related U.S. Application Data

[60] Division of Ser. No. 72,181, Jul. 9, 1987, which is a continuation of Ser. No. 759,013, Jul. 24, 1985, Pat. No. 4,705,444.

[51] Int. Cl.⁴ .............................................. B65G 65/02
[52] U.S. Cl. ..................................... 414/786; 414/217
[58] Field of Search .............. 414/786, 217, 615, 225, 414/226, 729, 730, 733, 917, 332, 609, 610, 612, 626, 621, 622, 586, 292; 118/500, 503, 730, 729, 50, 50.1; 432/239

[56] References Cited

U.S. PATENT DOCUMENTS

| | | | |
|---|---|---|---|
| 3,651,957 | 3/1972 | Ball et al. | 414/226 |
| 4,047,624 | 9/1977 | Dorenbos | 414/217 |
| 4,343,584 | 8/1982 | Hudgins | 414/226 X |
| 4,668,484 | 5/1987 | Elliott | 414/217 X |
| 4,674,939 | 6/1987 | Maney et al. | 414/292 |
| 4,815,912 | 3/1989 | Maney et al. | 414/217 |

FOREIGN PATENT DOCUMENTS

| | | | |
|---|---|---|---|
| 2702974 | 7/1978 | Fed. Rep. of Germany | 414/733 |
| 2512425 | 9/1981 | France . | |
| 710309 | 6/1954 | United Kingdom | 414/622 |

*Primary Examiner*—Frank E. Werner

[57] ABSTRACT

An automated cassette handler is disclosed for transporting a cassette containing integrated circuit wafers between first and second elevators in a standardized mechanical interface (SMIF) system for integrated circuit processing. The handler is adapted to grip and transport the cassette while positively pushing the wafers into the cassette.

6 Claims, 10 Drawing Sheets

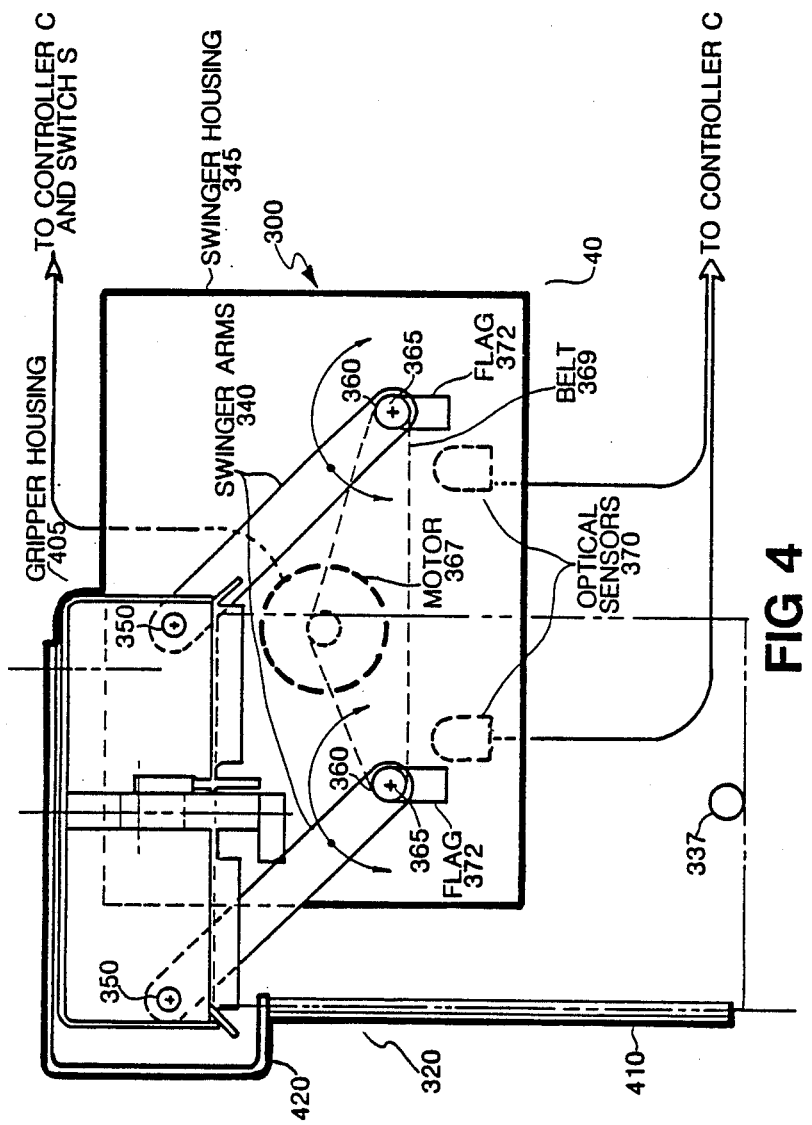

FIG 7 — FLOW CHART 1: CASSETTE TRANSFER FROM SMIF BOX TO EQUIPMENT ELEVATOR

METHOD FOR AUTOMATED CASSETTE HANDLING

CROSS-REFERENCES TO RELATED APPLICATION

This is a divisional application of Ser. No. 07/072,181, filed 7/9/87, which is a continuation of Ser. No. 06/759,013, filed 7/24/85, now Patent No. 4,705,444.

BACKGROUND OF THE INVENTION

As described by Tullis et al. in "Particle-Free Dockable Interface for Integrated Circuit Processing", U.S. patent application Ser. No. 536,600 filed Sept. 28, 1983, now Patent No. 4,532,970 and by Thrasher et al. in "Standardized Mechanical Interface System for Integrated Circuit Processing", U.S. patent application Ser. No. 536,599 filed Sept. 28, 1983, abandoned and by Tullis in "Interlocking Door Latch for Dockable Interface for Integrated Circuit Processing", U.S. patent application Ser. No. 594,498 filed Mar. 29, 1984, now Patent No. 4,534,389, a standardized mechanical interface (SMIF) system has been demonstrated for the fabrication of integrated circuits (ICs). The SMIF system reduces particle contamination during storage, transport and transfer in IC fabrication by mechanically minimizing the volume of gaseous media surrounding IC wafers during fabrication, insuring that much of this gas is essentially stationary relative to the wafers, and insuring that particles from exterior "ambient" environments cannot enter the wafer environment. Experiments have shown that the SMIF system of wafer handling reduces wafer particle contamination by as much as ten times when compared to conventional Class 100 clean room wafer handling practice.

Typically in the SMIF system, as shown in FIG. 1, a cassette 10 holding wafers 20 in cassette slots (not shown) is transferred through an interface port 25 between a SMIF box 30 and a SMIF environment under a canopy 40 by means of a SMIF elevator 50. Once inside the canopy 40, the cassette 10 is transferred to an equipment cassette elevator 60 which is part of a piece of processing equipment 70 in which the wafers 20 are to be processed. After processing, the wafers 20 are transferred back into the cassette 10 and the cassette 10 is transferred from the equipment elevator 60 of the processing equipment 70 to the SMIF elevator 50 which in turn transfers the cassette 10 back into the SMIF box 30. In some processing equipment 70, wafer handlers (not shown) place the processed wafers 20 in the cassette 10 with the wafers 20 protruding some distance out of the cassette slots. In other cases wafers 20 can slide on the cassette slots due to vibration or jerky motions of the processing equipment 70. In either case it is important to push the wafers 20 all the way into the cassette 10 before the SMIF elevator 50 is raised to transfer the cassette 10 into the SMIF box 30.

Formerly there have been two ways of transferring cassettes between SMIF elevators and equipment elevators while making sure that the wafers are pushed fully into the cassette. As shown in FIG. 1, a cassette manipulator 80 can be manually manipulated by an operator from outside of the SMIF canopy 40. Such a manipulator 80 is advantageous in that its motion within the canopy 40 does not cause undesired particle stirring and contamination of the wafers 20. Unfortunately, such a manipulator 80 requires a high degree of manual dexterity to place the cassette 10 in the desired location. A second approach, as shown in FIG. 2, is the use of a sealed glove 210 as in a conventional glove box attached to one wall 220 of the SMIF canopy 40 in order to transfer cassettes 10 between the SMIF elevator 50 and the equipment elevator 60. The glove box solution requires only a moderate degree of manual dexterity to transfer cassettes between the SMIF elevator 50 and the equipment elevator 60 while ensuring that all of the wafers 20 are pushed fully into the cassette 10. However, the glove box solution is strictly manual and the motion of the glove 210 can cause undesirable particle stirring within the SMIF canopy 40.

SUMMARY OF THE INVENTION

The present invention comprises an automated cassette handler which obviates the need for operator dexterity previously required to handle cassettes within a SMIF canopy while minimizing particle stirring within the SMIF canopy. In addition, a controller and associated sensors control the automated cassette handler so that once a SMIF box is placed on the interface port of the canopy, transfer of the cassette between the SMIF box and the equipment elevator can be initiated with the operation of a single switch.

The automated cassette handler transfers cassettes from a SMIF elevator to an equipment elevator and vice versa using a rotational swing motion while maintaining the cassette vertical throughout its travel. The use of rotational elements to move the cassette within the SMIF canopy is important in order to avoid the generation of particles as would occur through use of linear friction elements.

Rotational swing motion of the cassette is accomplished using two pivoted arms. The top ends of the pivoted arms hold onto a gripper/wafer depressor mechanism to hold the cassette and both push and retain the wafers fully within the cassette slots, while the bottom ends of the arms are connected to two mutually parallel shafts that are coupled such that the two arms rotate in unison. A motor exterior to the canopy drives the two arms within the canopy, while position sensors detect the location of the swinging arms at the ends of their travel. Typically, the operator places a SMIF box loaded with a cassette of wafers on the interface port of the canopy and actuates a switch. The controller for the cassette handler than initiates a sequence of actions to transfer the cassette from the SMIF box to the equipment elevator. Once the wafers are processed within the process equipment, a reverse sequence of actions is initiated by actuation of the switch so that the cassette is automatically transferred from the equipment elevator back into the SMIF box by the cassette handler. Alternatively, since some process equipment can place the processed wafers in a second cassette or place the processed wafers in the first cassette on a second second equipment elevator, a second cassette handler can also be used to transfer the cassette with the processed wafers into a SMIF box.

DESCRIPTION OF THE DRAWINGS

FIG. 4 shows a side view of the mechanism as shown in FIGS. 3A-3D.

DESCRIPTION OF THE PREFERRED EMBODIMENT

Figure 1:
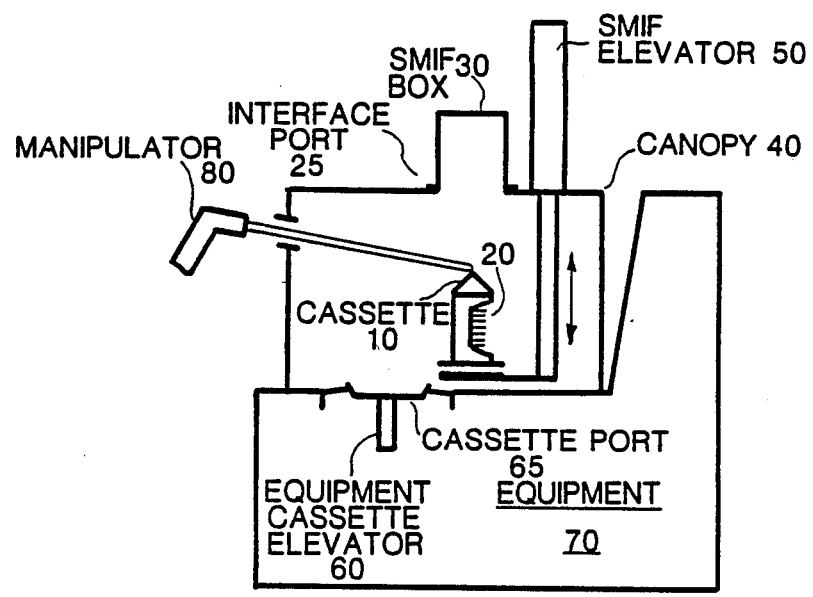
FIGS. 1 and 2 show SMIF system implementations according to the prior art.
Figure 2:
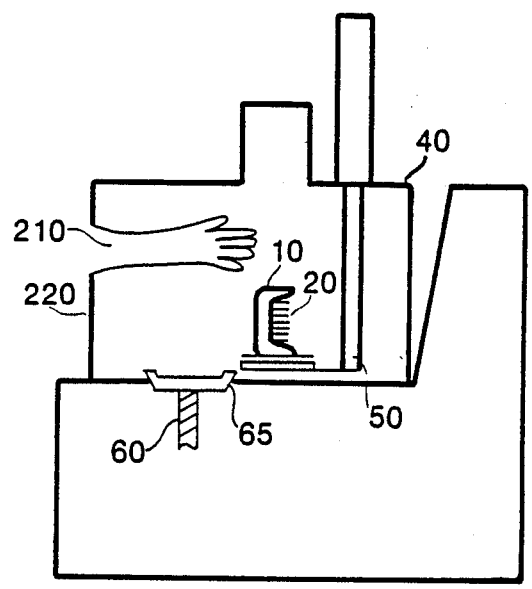

As shown in FIGS. 3A through 3D, the cassette handler 300 comprises two main components: a cassette gripper 310 and a wafer depressor 320. The cassette gripper 310 is used to positively grasp a cassette 330 and by means of two arms 340 lift the cassette 330 off of guides 335 on an elevator 50 and place the cassette 330 on guides 336 on elevator 60. Guides 335 and 336 therefore serve to locate cassette 330 on elevators 50 and 60, respectively, via cassette guide bar 337 as the cassette 330 is moved to the ends of rotational arcs 338 and 339. The wafer depressor 320 is used to push wafers 20 into the cassette 330 and to prevent the wafers 20 from falling out of the cassette 330 during transport of the cassette 330.

Figure 3A:
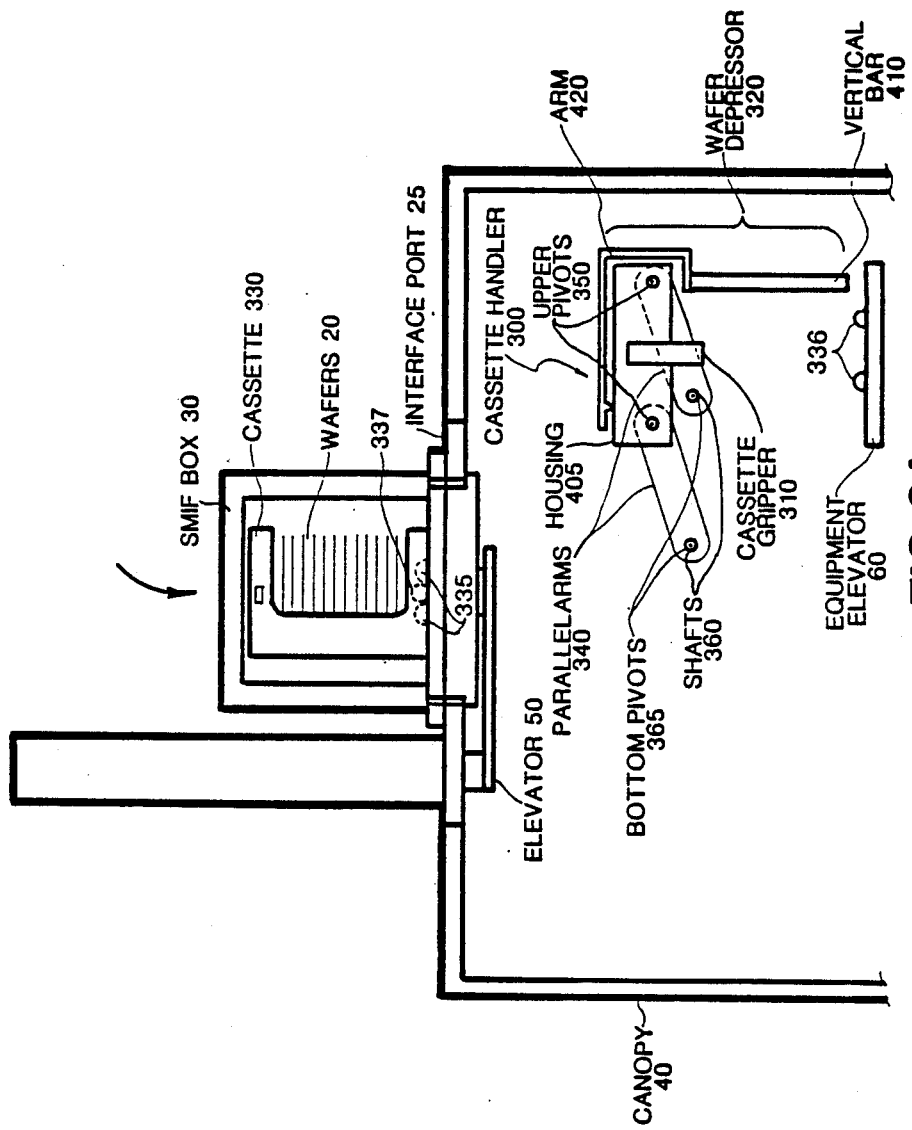
FIGS. 3A-3D show a cassette gripper and wafer depressor according to the present invention and a sequence of steps for their use.
Figure 3B:
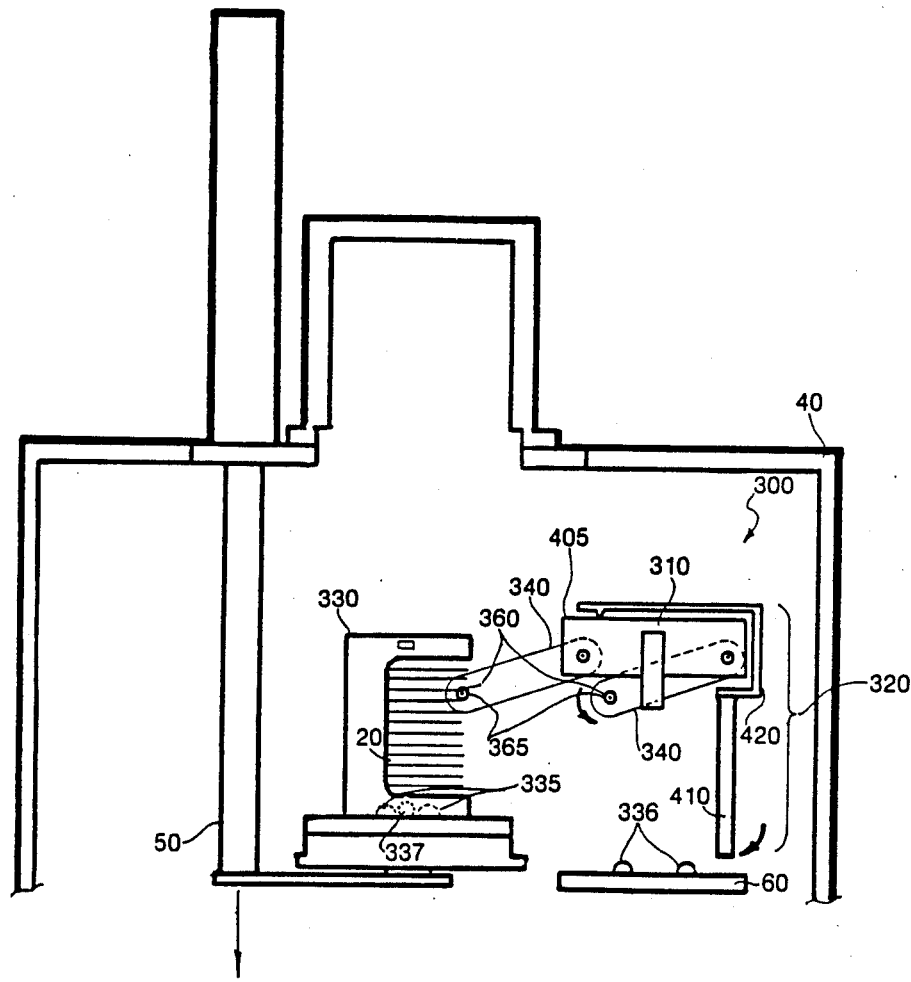
Figure 3C:
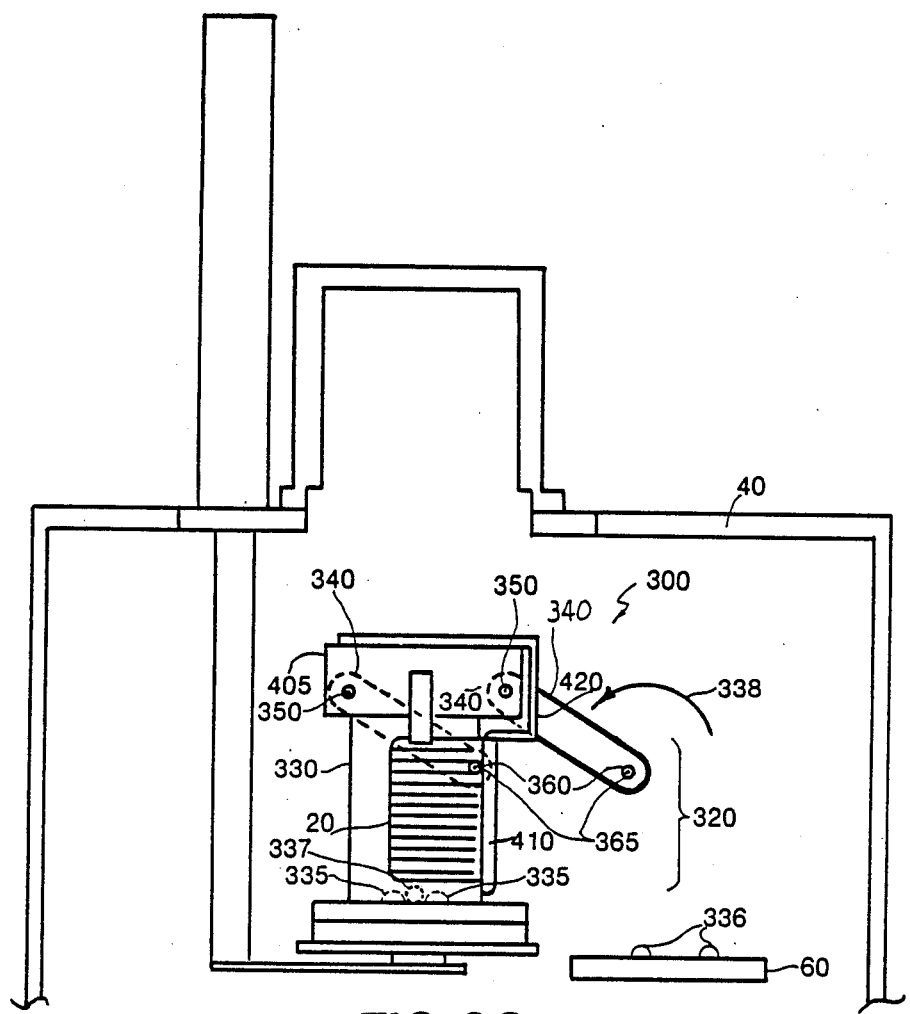
Figure 3D:
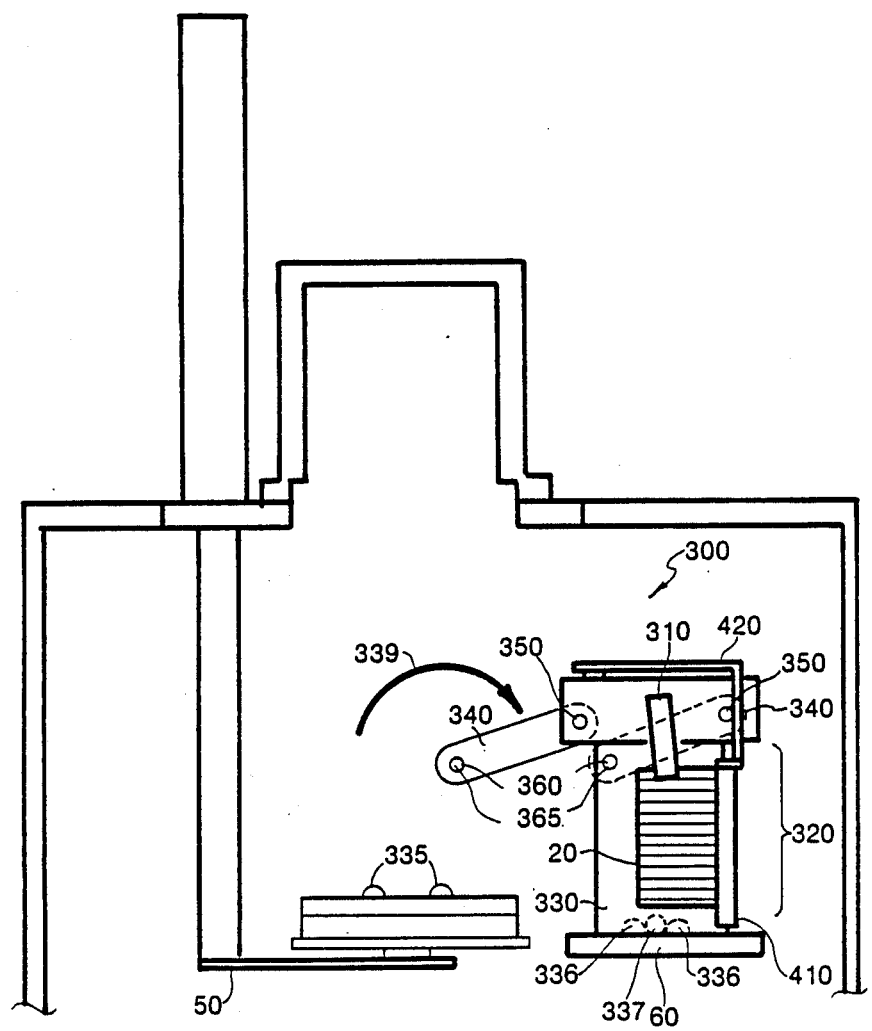

The lifting and transporting motion of the cassette handler 300 as shown in the sequence of FIGS. 3C-3D is accomplished using the two parallel arms 340 which couple the cassette gripper housing 405 to the canopy 40. As shown in FIG. 4, the upper ends of arms 340 are attached to the gripper housing 405 by upper pivots 350. The bottom ends of arms 340 are attached by two mutually parallel shafts 360 and two botom pivots 365 to swinger housing 345 which is an easily removable part of the canopy 40 so that the entire assembly 300 can be easily installed in canopy 40 as a module. The two arms 340 therefore are made to rotate in unison. A motor 367, which is typically mounted outside of canopy 40, drives shafts 360 by a drive linkage such as timing belt 369. Flags 372 are coupled to shafts 360 so that optical sensors 370 can be used to detect whether the arms 340 are at either extremity of their travel.

Figure 5:
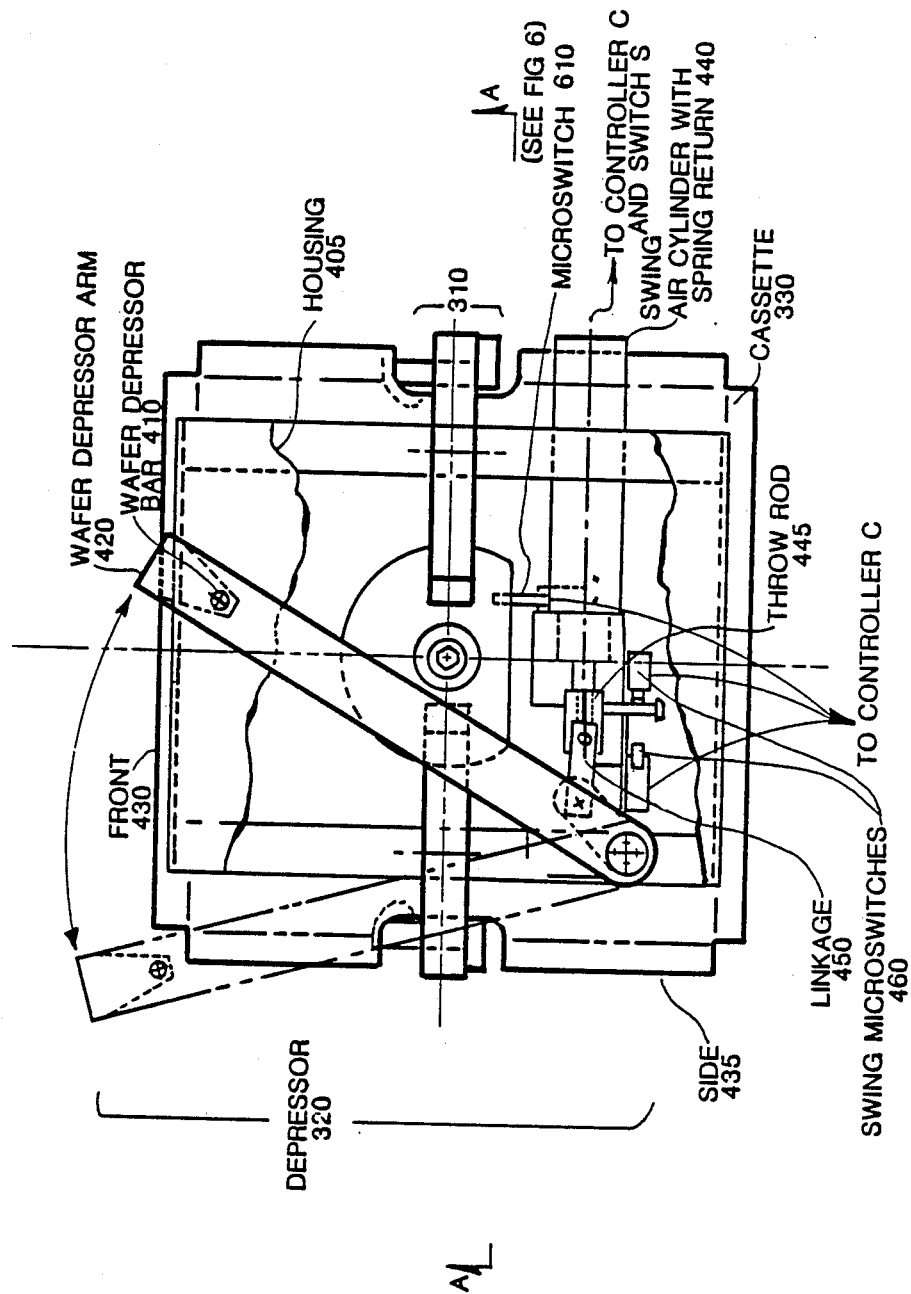
FIG. 5 shows a top view of the mechanism as shown in FIGS. 3A-3D.

As shown in FIGS. 3A-3D, and in detail in FIGS. 4 and 5, the wafer depressor 320 that pushes the wafers 20 into the cassette 330 is comprised of a vertical bar 410 which can rotate about its own axis, connected by a depressor arm 420 to the housing 405 so that the bar 410 can be swung around from the front 430 to the side 435 of the cassette 330 as shown in FIG. 5. Typically, a swing air cylinder 440 with spring return is coupled to arm 420 by air cylinder throw rod 445 and linkage 450 to swing the bar 410. A spring return is used to retract the air cylinder throw rod 445 to prevent blowing particles or lubricant into the canopy 40 through leaks in the rod seal of air cylinder 440. When the cassette 330 is gripped, the air cylinder 440 is simultaneously actuated to swing bar 410 across the front 430 of the cassette 330 and push the wafers 20 into the cassette 330. As long as the cassette 330 is gripped, the bar 410 remains in the front 430 of the cassette 330, thus preventing the wafers 20 from sliding out as, for example shown in the sequence of FIGS. 3C-3D, when the cassette 330 is moved from a SMIF elevator 50 to an equipment elevator 60. In addition, if there is power failure during operation of the depressor 320, the spring return within cylinder 440 will insure that the bar 410 is maintained in front 430 of the cassette 330 so that the wafers 20 are retained within the cassette 330. When the grip on the cassette 330 is released, the bar 410 is swung to the side 435 to permit the wafers 20 to be removed from the cassette 330 freely. Two swing microswitches 460 are used to detect whether the bar 410 is in the front 430 or on the side 435 of the cassette 330.

Figure 6:
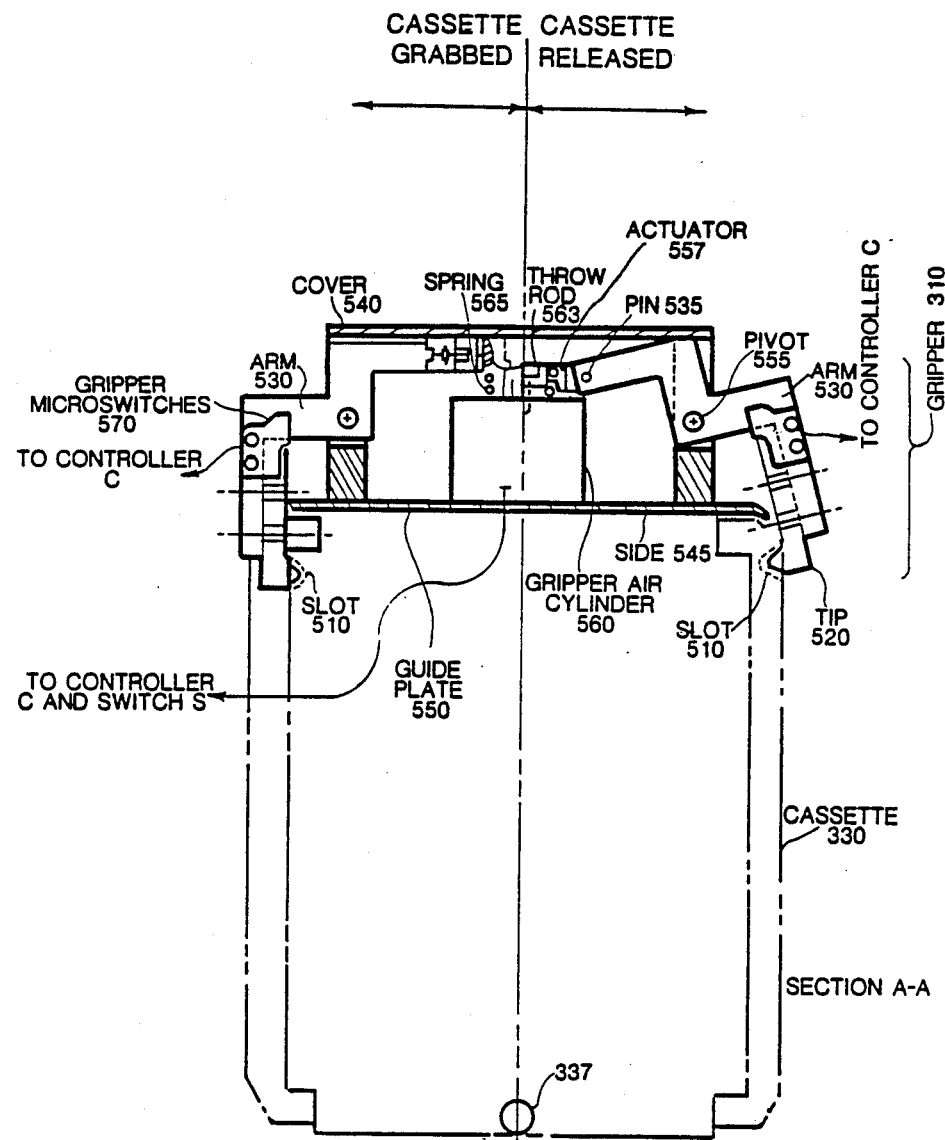
FIG. 6 shows a sectional view of the cassette gripper as indicated in FIG. 5.

The gripper 310 is shown in detailed cross-section in FIG. 6. The cassette 330 is provided, for example, with slots 510 adapted to receive tips 520 which can be changed to fit different styles of cassettes 330. The tips 520 are connected via arms 530 and pins 535 to cover 540. Cover 540, sides 545 and guide plate 550 form housing 405 as shown in FIG. 4. The arms 530 are pivotally coupled to sides 545 via pivots 555. The guide plate 550 serves to locate and center the cassette 330. The tips 520 are engaged via actuator 557, throw rod 563 of gripper cylinder 560 and spring 565, so that as the gripper cylinder 560 extends and retracts the tips 520 engage and disengage slots 510, respectively. As in the case of the swing air cylinder 440, the spring 565 is used to retract the gripper cylinder throw rod 563 to prevent blowing particles or lubricant into the canopy 40 through leaks in the rod seal of cylinder 560. In addition, if there is a power failure during operation of the gripper 310, the spring 565 will insure that the tips 565 are maintained engaged with the cassette 330 so that the cassette 330 will not be dropped. Each arm 530 is also provided with a gripper microswitch 570 to detect whether the cassette 330 is gripped by the gripper 310. An open/close microswitch 610 on housing 405 as shown in FIG. 5 detects whether the gripper 310 is open or closed.

Figure 7:
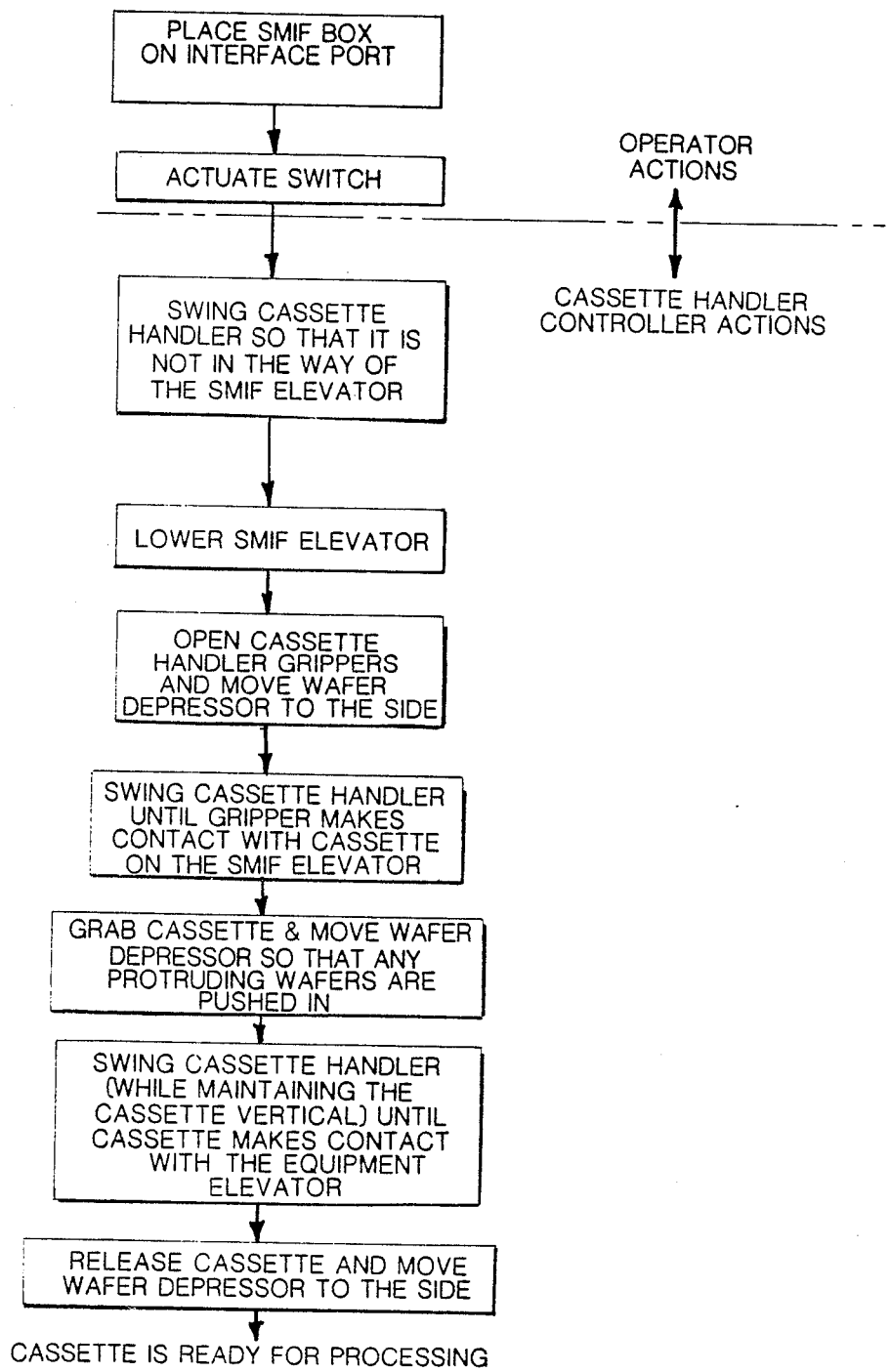
FIGS. 7 and 8 show the sequence of actions to transfer a cassette from a SMIF box to an equipment elevator as shown in FIGS. 3A-3D.
Figure 8:
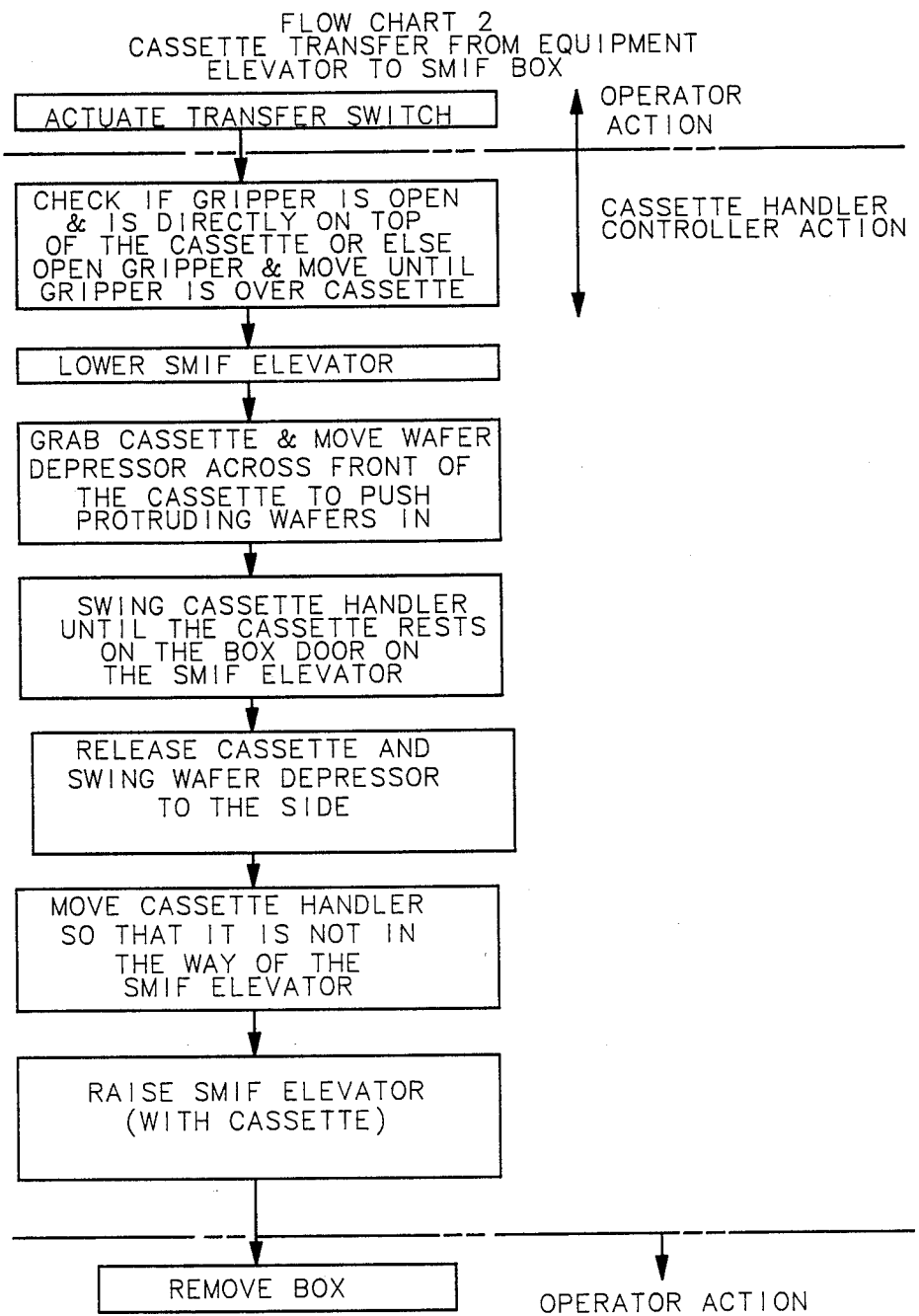

Typically, as shown in FIG. 3A, an operation first places a SMIF box 30 loaded with a cassette 330 of wafers 20 on the interface port 25 of the equipment canopy 40 and actuates a switch S which is electrically connected via a controller C to the air cylinders 440 and 560 as shown in FIGS. 5 and 6. The controller C also receives position information from sensor 370, 460, 610 and 570. The controller C then automatically initiates a sequence of actions as shown in FIGS. 3A-3D and in FIG. 7 to transfer the cassette 330 from the SMIF box 30 to the equipment elevator 60. Once the wafers 20 are processed in the equipment 70 and returned to the cassette 330, the cassette 330 is transferred from the equipment elevator 60 back into the SMIF box 30 using the sequence of actions shown in FIG. 8.

What is claimed is:

1. A method for automatically transporting integrated circuit wafers held in a wafer cassette within a canopy, said canopy coupled to a piece of integrated circuit processing equipment, said method comprising the steps of:
   (a) placing the cassette on an interface port handle of an interface port of the canopy;
   (b) actuating a switch coupled to a controller;
   (c) lowering the casette on the interface port handle into the canopy;
   (d) positioning a cassette handler into conjunction with the cassette;
   (e) gripping the cassette with a gripper coupled to the cassette handler;
   (f) swinging a wafer depressor partially moounted on an upper portion of and cantilevered from the cassette handler to push and retain wafers within the cassette;
   (g) swinging the cassette handler in a substantially constant plane with respect to the canopy to transport the cassette from the interface port handler to a processing equipment cassette handler without significantly changing the planar orientation of the cassette with respect to the canopy;

(h) swinging the wafer depressor to release the wafers within the cassette; and (i) ungripping the cassette, wherein the steps (c) through (i) are performed under the control of a controller without operator intervention.

2. A method as in claim 1 further comprising the steps of:

(j) sensing the presence of the cassette in conjunction with the cassette handler between steps (d) and (e);

(k) sensing the gripping of the cassette with the gripper during step (e);

(l) sensing the pushing of the wafers into the cassette during step (f);

(m) sensing the transport of the cassette to the processing equipment handler between steps (g) and (h);

(n) sensing the release of the wafers in the cassette by the wafer depressor during step (h); and (o) sensing the ungripping of the cassette after step (i).

3. The method as in claim 1 further comprising the steps of:

(p) actuating the switch;

(q) gripping the cassette;

(r) swinging the wafer depressor to push and retain the wafers within the cassette;

(s) swinging the cassette handler in a substantially constant plane with respect to the canopy to transport the cassette from the processing equipment handler to the interface port handler without significantly changing the planar orientation of the cassette with respect to the canopy;

(t) swinging the wafer depressor to release the wafers within the cassette;

(u) ungripping the cassette;

(v) swinging the cassette handler away from the cassette; and (w) raising the cassette out of the canopy on the interface port handler, wherein the steps (q) through (w) are performed under the control of a controller without operator intervention.

4. A method as in claim 3 further comprising the steps of:

(x) sensing the gripping of the cassette during step (q);

(y) sensing the pushing of the wafers into the cassette during step (r);

(z) sensing the transport of the cassette to the interface port handler between steps (s) and (t);

(aa) sensing the release of the wafers in the cassette by the wafer depressor during step (t);

(bb) sensing the ungripping of the cassette during step (u); and (cc) sensing the swinging of the cassette handler away from the cassette during step (v).

5. A method for automatically transporting integrated circuit wafers held in a wafer cassette within a canopy, said canopy coupled to a piece of intetrated circuit processing equipment, said method comprising the steps of:

(a) positioning a cassette handler in conjunction with the cassette;

(b) gripping the cassette with a gripper coupled to the cassette handler;

(c) swinging a wafer depressor partially mounted on an upper portion of and cantilevered from the cassette handler to push and retain wafers within the cassette; and (d) swinging the cassette handler in a substantially constant plane with respect to the canopy to transport the cassette to the piece of integrated circuit processing equipment without significantly changing the planar orientation of the cassette with respect to the canopy;

wherein the steps (a) through (d) are performed under the control of a controller wihtout operator intervention.

6. A method as in claim 5 further comprising the steps of:

(e) ungripping the cassette, (f) sensing the presence of the cassette in conjunction with the cassette handler between steps (a) and (e);

(g) sensing the gripping of the cassette with the gripper during step (b); and, (h) sensing the pushing of the wafers into the cassette during step (c).

* * * * *